(12) United States Patent
Huang

(10) Patent No.: US 11,774,286 B2
(45) Date of Patent: Oct. 3, 2023

(54) LIGHT DETECTION DEVICE HAVING STACKED LIGHT DETECTORS

(71) Applicant: Au Optronics Corporation, Hsinchu (TW)

(72) Inventor: Yen-Tang Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/511,593

(22) Filed: Oct. 27, 2021

(65) Prior Publication Data

US 2023/0052120 A1 Feb. 16, 2023

(30) Foreign Application Priority Data

Aug. 10, 2021 (TW) .................................. 110129367

(51) Int. Cl.
*G01J 3/28* (2006.01)
*G01J 1/42* (2006.01)
(Continued)

(52) U.S. Cl.
CPC ............... *G01J 3/28* (2013.01); *G01J 1/4228* (2013.01); *H01L 31/0224* (2013.01);
(Continued)

(58) Field of Classification Search
CPC ............. H01L 27/307; H01L 27/14643; H01L 27/14621; H01L 27/14609;
(Continued)

(56) References Cited

U.S. PATENT DOCUMENTS 8,368,784 B2 2/2013 Yamaguchi
8,907,923 B2 12/2014 Cho et al.
(Continued)

FOREIGN PATENT DOCUMENTS

CN 102254924 11/2011
CN 102341916 2/2012
(Continued)

OTHER PUBLICATIONS

Soohyun Kim, Hongcheol Lee, Jin-Won Chung, Seh-Won Ahn, Heon-Min Lee; n-Type microcrystalline silicon oxide layer and its application to high-performance back reflectors in thin-film silicon solar cells, Jun. 2013, Current Applied Physics, vol. 13, Issue 4, pp. 743-747 (Year: 2013).*

*Primary Examiner* — Jennifer D Bennett
*Assistant Examiner* — Erin R Garber
(74) *Attorney, Agent, or Firm* — JCIPRNET

(57) ABSTRACT

A light detection device including a substrate, a first light detector, a second light detector, and a switch element is provided. The first light detector is disposed on the substrate and includes a first active layer. The second light detector is disposed between the substrate and the first light detector and includes a second active layer. The switch element is disposed on the substrate. A horizontal projection of the second active layer on the substrate completely falls within a horizontal projection of the first active layer on the substrate. A negative electrode of the first light detector and a negative electrode of the second light detector are electrically connected to the switch element via a first metal layer.

16 Claims, 2 Drawing Sheets

(51) Int. Cl.
*H01L 31/0224* (2006.01)
*H01L 31/0232* (2014.01)
*G01J 1/02* (2006.01)
*G01J 1/04* (2006.01)
*G01J 1/44* (2006.01)

(52) U.S. Cl.
CPC ...... *H01L 31/02327* (2013.01); *G01J 1/0209* (2013.01); *G01J 1/0407* (2013.01); *G01J 1/0488* (2013.01); *G01J 1/44* (2013.01)

(58) Field of Classification Search
CPC ......... H01L 27/14647; H01L 27/14612; H01L 27/1214; H01L 27/14629; H01L 51/442; H01L 27/14667; H01L 27/14665; G01J 3/28; G01J 1/42; G01J 1/4228; G01J 1/4204; G01J 5/20; G01J 3/36; G02F 1/1368; G02F 1/133514
See application file for complete search history.

(56) References Cited

U.S. PATENT DOCUMENTS

| | | | |
|---|---|---|---|
| 9,122,352 B2 | 9/2015 | Cho et al. | |
| 9,166,089 B2 | 10/2015 | Yoshikawa et al. | |
| 9,871,079 B2* | 1/2018 | Lee | H10K 39/32 |
| 2010/0321341 A1 | 12/2010 | Cho et al. | |
| 2011/0019042 A1 | 1/2011 | Yamaguchi | |
| 2011/0244618 A1* | 10/2011 | Myong | H01L 31/03921 |
| | | | 257/E31.127 |
| 2011/0315190 A1 | 12/2011 | Yoshikawa et al. | |
| 2015/0062088 A1 | 3/2015 | Cho et al. | |
| 2016/0079464 A1* | 3/2016 | Sasaki | H01L 31/02005 |
| | | | 257/432 |
| 2019/0096949 A1* | 3/2019 | Huang | H01L 27/307 |
| 2019/0157470 A1* | 5/2019 | Send | G01S 7/4816 |
| 2021/0118920 A1* | 4/2021 | Kim | H01L 51/4246 |
| 2021/0159262 A1 | 5/2021 | Hou et al. | |
| 2021/0175286 A1* | 6/2021 | Park | H01L 27/14636 |
| 2021/0313384 A1* | 10/2021 | Tada | H01L 31/03762 |

FOREIGN PATENT DOCUMENTS

| | | |
|---|---|---|
| CN | 113196504 | 7/2021 |
| TW | I410703 | 10/2013 |
| TW | I706553 | 10/2020 |

* cited by examiner

LIGHT DETECTION DEVICE HAVING STACKED LIGHT DETECTORS

CROSS-REFERENCE TO RELATED APPLICATION

This application claims the priority benefit of Taiwan patent application no. 110129367, filed on Aug. 10, 2021. The entirety of the above-mentioned patent application is hereby incorporated by reference herein and made a part of this specification.

BACKGROUND

Technical Field

The disclosure relates to a light detection device.

Description of Related Art

A light detection device detects existence of light according to a process in which electromagnetic waves (light) generate electrical signals. However, in a conventional light detection device, light detectors corresponding to different light wavebands are often disposed in the same layer, which leads to the fact that the overall size of area occupied by pixels is excessively large. In addition, the light detectors corresponding to different light wavebands usually control frequency sweep operations by means of different switch elements, thus resulting in a small aperture ratio of the light detection device. Under said configuration, time differences exist in the frequency sweep operations performed on light beams of different light wavebands, and the overall frequency sweep time is long. Moreover, the light detectors perform color resist alignment according to the corresponding light wavebands, which further complicates the manufacturing process.

SUMMARY

The disclosure provides a light detection device which neither requires color resist alignment nor encounters issues of time differences in light detection operations performed on light beams of different light wavebands, and the light detection device further has a small pixel area, a large aperture ratio, and a short frequency sweep time.

According to an embodiment of the disclosure, a light detection device including a substrate, a first light detector, a second light detector, and a switch element is provided. The first light detector is disposed on the substrate and includes a first active layer. The second light detector is disposed between the substrate and the first light detector, and the second light detector includes a second active layer. The switch element is disposed on substrate. A horizontal projection of the second active layer on the substrate completely falls within a horizontal projection of the first active layer on the substrate, and a negative electrode of the first light detector and a negative electrode of the second light detector are electrically connected to the switch element via a first metal layer.

In view of the above, in the light detection device provided in one or more embodiments of the disclosure, the first light detector and the second light detector corresponding to different light wavebands are arranged in a stacked manner. Compared with the conventional way to arrange the light detectors in the same layer, the way to arrange the first and second light detectors corresponding to different light wavebands in this disclosure in a stacked manner may lead to a significant reduction of the pixel area with no need of performing the process of color resist alignment. In addition, the first light detector and the second light detector use the same switch element to perform a frequency sweep operation at the same time, which leads to the reduction of the number of switch elements and an increase in the aperture ratio; moreover, there exists no time difference in the frequency sweep operations performed on light beams of different light wavebands, and the overall frequency sweep time may be reduced.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
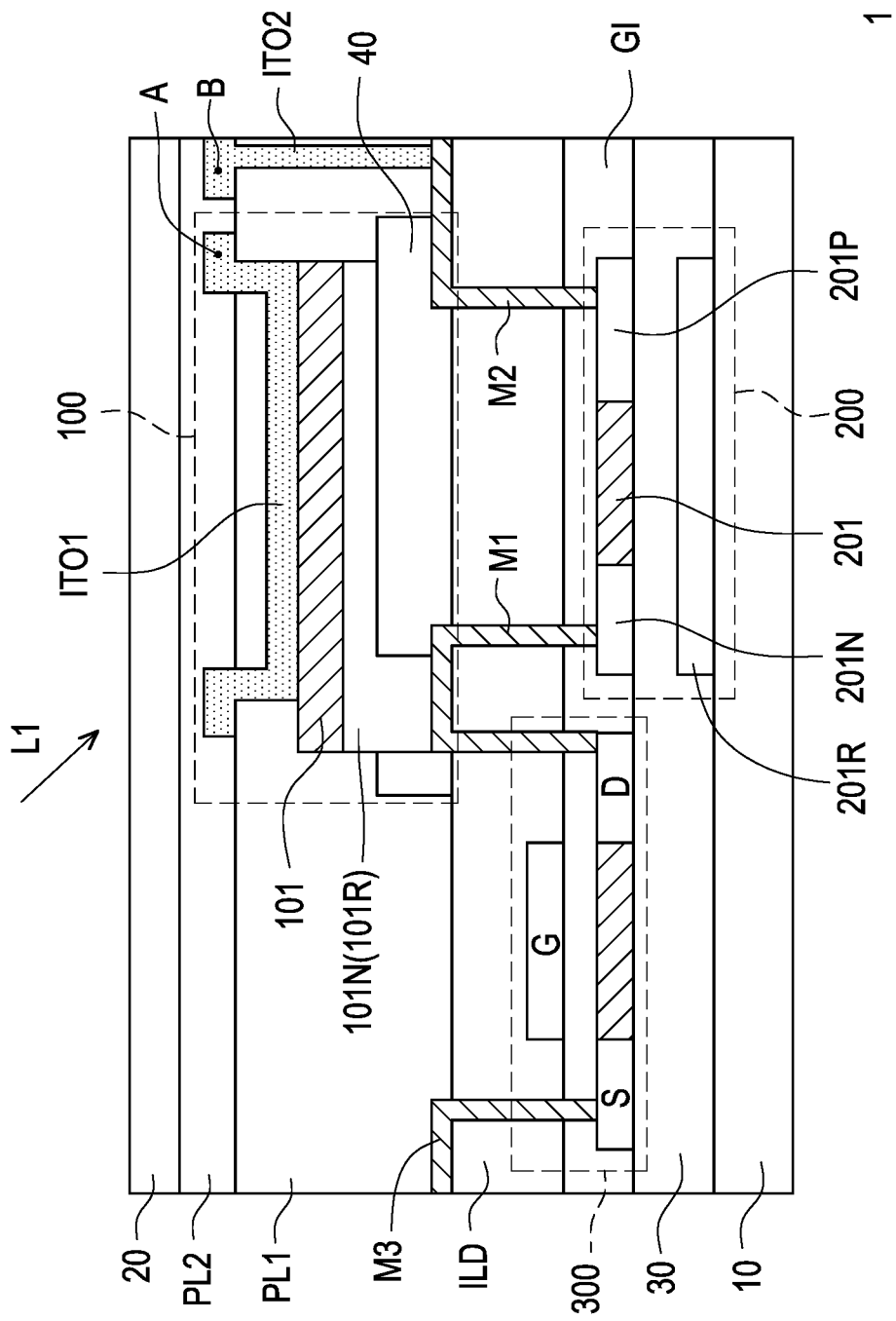
FIG. 1 is a schematic cross-sectional view of a light detector according to an embodiment of the disclosure.

With reference to FIG. 1, which is a schematic cross-sectional view of a light detector according to an embodiment of the disclosure, a light detector 1 includes a substrate 10, a protection layer 20, a first light detector 100, a second light detector 200, and a switch element 300. The first light detector 100 is disposed on the substrate 10 and includes a first active layer 101. The second light detector 200 is disposed between the substrate 10 and the first light detector 100, and the second light detector 200 includes a second active layer 201. The switch element 300 is a thin film transistor (TFT) and is disposed on the substrate 10, and the switch element 300 and the second light detector 200 are disposed on the same layer to shorten the manufacturing process. A horizontal projection of the second active layer 201 on the substrate 10 completely falls within a horizontal projection of the first active layer 101 on the substrate 10, and a negative electrode 101N of the first light detector 100 and a negative electrode 201N of the second light detector 200 are electrically connected to the switch element 300 via a first metal layer M1.

Figure 2:
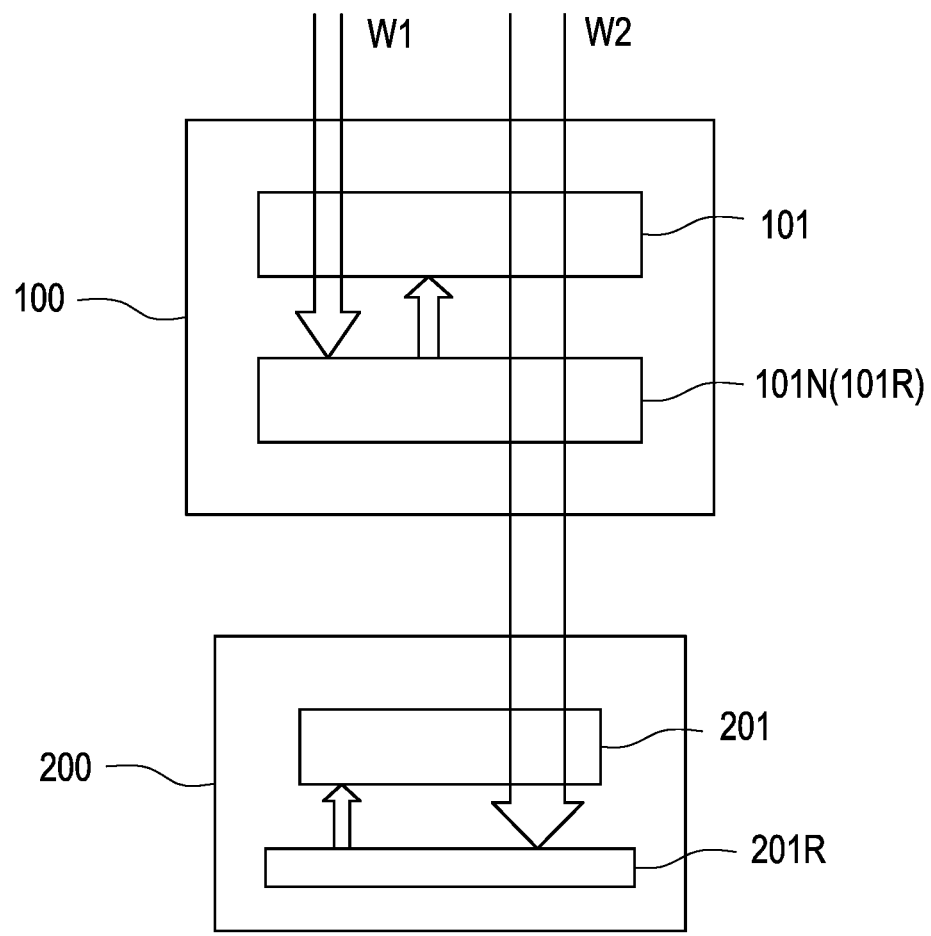
FIG. 2 is a schematic view of detecting different wavebands by a first light detector and a second light detector according to an embodiment of the disclosure.

With reference to FIG. 2, which is a schematic view of detecting different wavebands by the first light detector and the second light detector according to the embodiment depicted in FIG. 1, a first waveband W1 detected by the first light detector 100 is different from a second waveband W2 detected by the second light detector 200 in this embodiment, and a wavelength of the first waveband W1 is shorter than a wavelength of the second waveband W2. As shown in FIG. 1 and FIG. 2, the first light detector 100 and the second light detector 200 that detect light beams of different wavebands are arranged in a stacked manner. By contrast, in the conventional light detection device, the light detectors that detect light beams of different wavebands are arranged in the same layer, which leads to the fact that the overall size of area occupied by pixels is excessively large. In the light detection device provided in this embodiment, the pixel area is significantly reduced.

Figure 3:
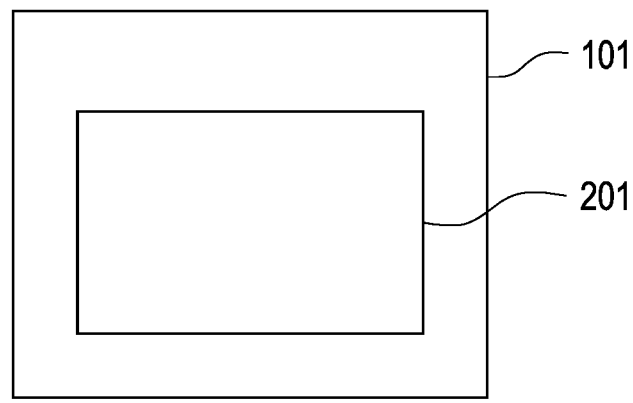
FIG. 3 is a schematic plan of a first active layer and a second active layer according to an embodiment of the disclosure.

With reference to FIG. 3, which is a schematic plan of the first active layer and the second active layer according to the embodiment depicted in FIG. 1, the horizontal projection of the second active layer 201 on the substrate 10, as described above, completely falls within the horizontal projection of the first active layer 101 on the substrate 10. Besides, in the light detection device 1 provided in this embodiment, the first light detector 100 is disposed on the second light detector 200; when a light beam L1 to be detected enters the light detection device 1 from the protective layer 20, the first active layer 101 of the first light detector 100 absorbs and detects a first waveband W1 with a relatively high frequency in the light beam L1. In other words, the light beam with the first waveband W1 in the light beam L1 is absorbed by the first active layer 101, and the corresponding electrical signal is generated. Besides, only the light beams with the wavebands other than the first waveband W1 in the light beam L1 continue to travel to the second light detector 200. By contrast, the conventional light detection device requires a color resist layer to filter out light beams of the wavebands other than the waveband detected by the corresponding light detector and thus requires a sophisticated color resist alignment process. The first light detector 100 provided in this embodiment not only has the function of detecting the first waveband W1 but also filters out the light beam of the first waveband W1 for the second light detector 200 and thus does not require any color resist layer. Since an area of the first active layer 101 is larger than an area of the second active layer 201, it is ensured that the first light detector 100 completely filters out the light beam of the first waveband W1 for the second light detector 200.

With reference to FIG. 1, the first light detector 100 and the second light detector 200 are connected to the same switch element 300, which leads to the reduction of the number of switch elements and the increase in the aperture ratio of the light detection device 1. Besides, frequency sweep operations of the first light detector 100 and the second light detector 200 may be controlled by the switch element 300 at the same time; when the first light detector 100 detects the light beam of the first waveband W1, the second light detector 200 may detect the light beam of the second waveband W2 at the same time. Hence, there exists no time difference in the frequency sweep operations performed on light beams of different light wavebands, and the overall frequency sweep time may be reduced.

According to an embodiment of the disclosure, as shown in FIG. 1, a horizontal projection of the first metal layer M1 on the substrate 10 completely falls within the horizontal projection of the first active layer 101 on the substrate 10. In other words, the first active layer 101 shields the first metal layer M1 to ensure that neither stray light nor light beams that fail to pass the first active layer 101 and are reflected by the first metal layer M1 enter the second active layer 201 and affect a detection result of the second light detector 200. According to the disclosure and embodiment, the first active layer 101 includes a-SiO$_x$:H or a-Si:H, an energy level structure of which allows the light beam of the first waveband W1 to be absorbed and detected in the first active layer 101 and allows the light beam of the second waveband W2 not to be absorbed by the first active layer 101; thereby, the light beam of the second waveband W2 may penetrate the first active layer 101 and continue to travel to the second active layer 201. The second active layer 201 includes poly-Si, an energy level structure of which allows the light beam of the second waveband W2 to be absorbed and detected. According to an embodiment of the disclosure, a thickness of the first active layer 101 falls within a range from 0.5 μm to 1 μm, and a thickness of the second active layer 201 is greater than or equal to 2 μm.

With reference to FIG. 1 and FIG. 2, the negative electrode 101N of the first light detector 100 is electrically connected between the first active layer 101 and the first metal layer M1, and the negative electrode 101N may also serve as a first light reflection layer 101R. The first light reflection layer 101R is disposed between the first active layer 101 and the second active layer 201, and the horizontal projection of the second active layer 201 on the substrate 10 completely falls within a horizontal projection of the first light reflection layer 101R on the substrate 10, so as to reflect the light beam of the waveband other than the second waveband W2 detected by the second active layer 201 and/or the light beam of the first waveband W1 that is not completely absorbed by the first active layer 101 (as shown by an arrow indicating the reflection upward from the first light reflection layer 101R in FIG. 2), whereby a detection result of the first light detector 100 may be optimized.

According to an embodiment of the disclosure, the first light reflection layer 101R may include μc-SiOx:H(n) or an N-type transparent conductive oxide coating. According to some embodiments of the disclosure, when a refractive index of the first light reflection layer 101R falls within a range from 1.9 to 2.2, and/or when a thickness of the first light reflection layer 101R falls within a range from 30 nm to 50 nm, the reflection of the light beam close to the wavelength of an energy gap structure of the first active layer 101 is enhanced, which may optimize the ability of reflecting the light beam by the first light reflection layer 101R and simultaneously satisfy electrical requirements for the operation of the first light detector 100.

With reference to FIG. 1 and FIG. 2, the light detection device 1 further includes a metal reflection layer 201R disposed between the second active layer 201 and the substrate 10, and the horizontal projection of the second active layer 201 on the substrate 10 completely falls within a horizontal projection of the metal reflection layer 201R on the substrate 10. The metal reflection layer 201R is disposed to reflect the light beam of the second waveband W2 that is not completely absorbed by the second active layer 201 (as shown by an arrow indicating the reflection upward from the metal reflection layer 201R in FIG. 2), so as to optimize the detection result of the second light detector 200 and shield the external light entering from the substrate 10 to the light detection device 1 to prevent detection errors of the second light detector 200.

With reference to FIG. 1, the light detection device 1 further includes a second metal layer M2, an insulating layer 40, a first transparent electrode layer ITO1, and a second transparent electrode layer ITO2. The first active layer 101 is located between the first transparent electrode layer ITO1 and the second active layer 201 and between the first transparent electrode layer ITO1 and the first light reflection layer 101R. The second metal layer M2 is electrically connected between a positive electrode 201P of the second light detector 200 and the second transparent electrode layer ITO2, and the insulating layer 40 is disposed between the first light reflection layer 101R and the second metal layer M2 to insulate the first light reflection layer 101R and the second metal layer M2. A signal of the first light detector 100 is output by the first transparent electrode layer ITO1 (marked as a point A in FIG. 1), and a signal of the second light detector 200 is output by the second transparent electrode layer ITO2 (marked as a point B in FIG. 1).

To sum up, in the light detection device provided by one or more embodiments of the disclosure, the first light detector and the second light detectors corresponding to different light wavebands are arranged in a stacked manner, which greatly reduces the pixel area of the light detection device. By contrast, in the conventional light detection device, the light detectors that detect light beams of different wavebands are disposed in the same layer, and thereby the overall pixel area is excessively large, which is not conducive to miniaturization. The arrangement of stacking the first light detector and the second light detector further leads the omission of the color resist alignment process. In addition, the first light detector and the second light detector apply the same switch element to perform the frequency sweep operation at the same time, which leads to the reduction of the number of the switch elements and the increase in the aperture ratio. Moreover, there exists no time difference in the frequency sweep operations performed on light beams of different light wavebands, and the overall frequency sweep time may be reduced.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A light detection device, comprising:
a substrate;
a first light detector, disposed on the substrate and comprising a first active layer;
a second light detector, disposed between the substrate and the first light detector and comprising a second active layer;
a switch element, disposed on the substrate;
a first transparent electrode layer;
a second metal layer; and
a second transparent electrode layer,
wherein a horizontal projection of the second active layer on the substrate completely falls within a horizontal projection of the first active layer on the substrate, and a negative electrode of the first light detector and a negative electrode of the second light detector are electrically connected to the switch element via a first metal layer,
wherein the negative electrode of the first light detector is further used as a first light reflection layer disposed between the first active layer and the second active layer to reflect a light beam of a waveband other than a light beam of a waveband detected by the second active layer,
wherein the first active layer is located between the first transparent electrode layer and the second active layer, and wherein the second metal layer is electrically connected between a positive electrode of the second light detector and the second transparent electrode layer.

2. The light detection device according to claim 1, wherein a horizontal projection of the first metal layer on the substrate completely falls within the horizontal projection of the first active layer on the substrate.

3. The light detection device according to claim 1, wherein the first active layer comprises a-SiO$_x$:H or a-Si:H.

4. The light detection device according to claim 1, wherein the first active layer is disposed to detect a waveband with a wavelength smaller than a wavelength of a waveband detected by the second active layer.

5. The light detection device according to claim 1, wherein the switch element and the second light detector are disposed in a same layer.

6. The light detection device according to claim 1, wherein a refractive index of the first light reflection layer falls within a range from 1.9 to 2.2.

7. The light detection device according to claim 1, wherein a thickness of the first light reflection layer falls within a range from 30 nm to 50 nm.

8. The light detection device according to claim 1, wherein the first light reflection layer comprises μc-SiO$_x$:H (n) or an N-type transparent conductive oxide coating.

9. The light detection device according to claim 1, wherein the first light reflection layer is electrically connected between the first active layer and the first metal layer.

10. The light detection device according to claim 1, wherein the horizontal projection of the second active layer on the substrate completely falls within a horizontal projection of the first light reflection layer on the substrate.

11. The light detection device according to claim 1, further comprising a second metal layer and an insulating layer, wherein the second metal layer is electrically connected to a positive electrode of the second light detector, and the insulating layer is disposed between the first light reflection layer and the second metal layer.

12. The light detection device according to claim 1, wherein a thickness of the first active layer falls within a range from 0.5 μm to 1 μm.

13. The light detection device according to claim 1, wherein a thickness of the second active layer is greater than or equal to 2 μm.

14. The light detection device according to claim 1, further comprising a metal reflection layer disposed between the second active layer and the substrate, and the horizontal projection of the second active layer on the substrate completely falls within a horizontal projection of the metal reflection layer on the substrate.

15. The light detection device according to claim 1, wherein the first transparent electrode layer and the second transparent electrode layer are respectively disposed to output signals of the first light detector and the second light detector.

16. The light detection device according to claim 1, wherein the second active layer comprises Poly-Si.

* * * * *